United States Patent
Cho et al.

(10) Patent No.: US 9,629,237 B2
(45) Date of Patent: Apr. 18, 2017

(54) ROLLABLE DISPLAY DEVICE

(71) Applicant: LG Display Co., Ltd., Seoul (KR)

(72) Inventors: Seok-Hyo Cho, Goyang-si (KR); Chul Park, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/755,965

(22) Filed: Jun. 30, 2015

(65) Prior Publication Data

US 2016/0029474 A1    Jan. 28, 2016

Related U.S. Application Data

(63) Continuation of application No. 14/546,833, filed on Nov. 18, 2014, now Pat. No. 9,098,241.

(30) Foreign Application Priority Data

Jul. 22, 2014 (KR) .......................... 10-2014-0092343
Jul. 24, 2014 (KR) .......................... 10-2014-0093790

(51) Int. Cl.
| | | |
|---|---|---|
| G09F 9/30 | (2006.01) | |
| H04M 1/02 | (2006.01) | |
| H05K 1/02 | (2006.01) | |
| G06F 1/16 | (2006.01) | |
| B65H 75/44 | (2006.01) | |
| B65H 75/28 | (2006.01) | |
| G09F 15/00 | (2006.01) | |

(52) U.S. Cl.
CPC ............. *H05K 1/028* (2013.01); *B65H 75/28* (2013.01); *B65H 75/4402* (2013.01); *G06F 1/1652* (2013.01); *G09F 9/301* (2013.01); *B65H 2301/3611* (2013.01); *B65H 2301/415* (2013.01); *G09F 15/0062* (2013.01); *H04M 1/0268* (2013.01)

(58) Field of Classification Search
CPC .... G06F 1/1652; H04M 1/0268; G09F 9/301; Y10S 345/905
See application file for complete search history.

(56) References Cited

U.S. PATENT DOCUMENTS

| | | |
|---|---|---|
| 5,467,210 A | 11/1995 | Kishigami |
| 5,812,891 A | 9/1998 | Tokura |
| 6,038,800 A | 3/2000 | Seidel |
| 6,498,597 B1 | 12/2002 | Sawano |
| 6,762,929 B2 | 7/2004 | Sawyer |
| 6,771,232 B2 | 8/2004 | Fujieda et al. |
| 7,196,692 B2 | 3/2007 | Mochizuki et al. |
| 7,559,163 B2 | 7/2009 | Ofuji et al. |

(Continued)

FOREIGN PATENT DOCUMENTS

| | | |
|---|---|---|
| CN | 103069473 A | 4/2013 |
| EP | 2634765 A2 | 9/2013 |

(Continued)

*Primary Examiner* — Nathan Milakovich
(74) *Attorney, Agent, or Firm* — Birch, Stewart, Kolasch & Birch, LLP

(57) ABSTRACT

A rollable display device includes a display panel for displaying an image, a printed circuit board connected to an edge of the display panel, and a roller which the display panel is rolled onto or unrolled from. The roller has a cylindrical shape having an inner space, and the printed circuit board is disposed in the inner space.

19 Claims, 16 Drawing Sheets

(56) References Cited

U.S. PATENT DOCUMENTS

| | | | |
|---|---|---|---|
| 8,001,711 B2* | 8/2011 | LaFarre | G02F 1/167 40/515 |
| 8,376,581 B2 | 2/2013 | Auld et al. | |
| 8,477,250 B2* | 7/2013 | Schellingerhout | G09F 9/301 345/55 |
| 8,477,464 B2 | 7/2013 | Visser et al. | |
| 8,493,726 B2 | 7/2013 | Visser et al. | |
| 8,508,920 B2 | 8/2013 | Huitema et al. | |
| 8,516,728 B2 | 8/2013 | Jung | |
| 8,665,236 B2 | 3/2014 | Myers | |
| 8,711,566 B2 | 4/2014 | O'Brien | |
| 2004/0264851 A1 | 12/2004 | Amiri | |
| 2005/0040962 A1* | 2/2005 | Funkhouser | G06F 1/1601 340/815.4 |
| 2005/0176470 A1 | 8/2005 | Yamakawa | |
| 2006/0038745 A1 | 2/2006 | Naksen et al. | |
| 2006/0207142 A1* | 9/2006 | Kochan | G09F 11/29 40/604 |
| 2006/0288571 A1 | 12/2006 | Seo et al. | |
| 2007/0241002 A1* | 10/2007 | Wu | G06F 1/1601 206/150 |
| 2008/0049003 A1 | 2/2008 | Hasegawa | |
| 2008/0247126 A1 | 10/2008 | Otsuka et al. | |
| 2010/0038042 A1 | 2/2010 | Criss | |
| 2010/0117975 A1 | 5/2010 | Cho | |
| 2012/0050075 A1 | 3/2012 | Salmon | |
| 2012/0314400 A1 | 12/2012 | Bohn et al. | |
| 2013/0314762 A1 | 11/2013 | Kwack et al. | |
| 2014/0247544 A1 | 9/2014 | Ryu | |
| 2015/0009636 A1 | 1/2015 | Jeong et al. | |
| 2015/0029229 A1 | 1/2015 | Voutsas | |
| 2015/0227171 A1* | 8/2015 | Choi | G06F 1/1652 361/749 |
| 2016/0139633 A1* | 5/2016 | Lee | G06F 1/1652 345/33 |
| 2016/0187929 A1* | 6/2016 | Kim | G06F 1/1652 345/184 |
| 2016/0231843 A1* | 8/2016 | Kim | G06F 3/0412 |
| 2016/0239052 A1* | 8/2016 | Kim | G06F 1/1652 |

FOREIGN PATENT DOCUMENTS

| | | |
|---|---|---|
| JP | 2000-132122 A | 5/2000 |
| JP | 2001-100661 A | 4/2001 |
| JP | 2002-15858 A | 1/2002 |
| JP | 2002-15859 A | 1/2002 |
| JP | 2002-328625 A | 11/2002 |
| JP | 2008-52040 A | 3/2008 |
| JP | 2008-286901 A | 11/2008 |
| JP | 2011-49411 A | 3/2011 |
| JP | 2011-253029 A | 12/2011 |
| KR | 10-2013-0028030 A | 3/2013 |
| KR | 10-2013-0142447 A | 12/2013 |
| TW | 200703166 A | 1/2007 |
| TW | 201237720 A1 | 9/2012 |
| WO | WO 2014/080176 A1 | 5/2014 |

* cited by examiner

ROLLABLE DISPLAY DEVICE

CROSS-REFERENCE TO RELATED APPLICATIONS

This Application is a Continuation of co-pending U.S. application Ser. No. 14/546,833 filed Nov. 18, 2014, which claims the benefit of priority of Korean Patent Application No. 10-2014-0092343 filed on Jul. 22, 2014, and No. 10-2014-0093790 filed on Jul. 24, 2014, which are hereby incorporated by reference for all purposes as if fully set forth herein.

BACKGROUND

Field of the Invention

The present disclosure relates to a rollable display device. The present disclosure also relates to a rollable display device where a printed circuit board is stably fixed and a display panel is automatically rolled and unrolled.

Discussion of the Related Art

Recently, as the information society progresses, display devices processing and displaying a large amount of information have rapidly advanced and various flat panel displays (FPDs) have been developed. Specifically, the FPDs such as a liquid crystal display (LCD) device, a plasma display panel (PDP) device, an organic light emitting diode (OLED) display device and a field emission display (FED) device having superior performance with a thin profile, a light weight, and a low power consumption have substituted for a cathode ray tube (CRT).

Since the FPD uses a glass substrate resistant to the heat of a fabrication process, there exists a limit to the light weight, the thin profile and the flexibility of the FPD. As a result, a flexible display device which performs display function even when bent by using a flexible material such as plastic instead of the glass has been researched as a next generation FPD.

The flexible display devices may be classified into: an unbreakable display device which has a relatively high durability; a bendable display device which is capable of being bent; a rollable display device which is capable of being rolled; and a foldable display device which is capable of being folded. The flexible display device has advantages in a space application and interior decoration and design and has various applications. Specifically, a rollable display device has been researched for an ultra thin profile, a light weight and a portable size having a large display area.

SUMMARY OF THE INVENTION

In accordance with the present invention, as embodied and broadly described herein, the present invention provides a display device including a flexible display panel, a roller on which the flexible display panel is selectively wound and unwound, and a printed circuit board connected to the flexible display panel. The printed circuit board is located within the roller. A connector is provided interconnecting one end of the flexible display panel to the printed circuit board. The roller includes an aperture extending longitudinally along the roller. The connector is located within the aperture. An adhesive is provided for fixing the one end of the flexible display panel to the roller. A pin is provided to connect the printed circuit board to the roller. The pin has a first end located in a through hole provided in the roller and a second end located in a pin receiving portion provided in the roller, and extends through a pin hole provided in the printed circuit board. The pin receiving portion may be a fixing groove provided in the roller. The roller may be formed as a circular cylinder or a hollow tube.

In another aspect, the present invention provides a display device including a case, a flexible display panel, a roller located within the case and on which the flexible display panel is selectively wound and unwound, and an elevating mechanism configured to extend the flexible display panel from the case. The elevating mechanism includes a guide rail attached to the flexible display panel, and a first link and a second link configured to elevate the guide rail. A first guide bracket is located at one end of the first link and movable along the guide rail, and a second guide bracket is located at one end of the second link and movable along the guide rail. The first guide bracket and the second guide bracket each include a guide portion located within the guide rail, and a rotational link portion extending from the guide portion. The rotational link portion of the first guide bracket is rotatably connected to the first link, and the rotational link portion of the second guide bracket is rotatably connected to the second link. A fixing bracket is provided to which the guide rail is attached. The fixing bracket includes a fixing portion having an inserting hole into which one end of the flexible display panel is inserted.

It is to be understood that both the foregoing general description and the following detailed description are exemplary and explanatory and are intended to provide further explanation of the embodiments as claimed.

BRIEF DESCRIPTION OF THE DRAWINGS

The accompanying drawings, which are included to provide a further understanding of the disclosure and are incorporated in and constitute a part of this specification, illustrate embodiments and together with the description serve to explain the principles of the disclosure. In the drawings.

DETAILED DESCRIPTION OF THE ILLUSTRATED EMBODIMENTS

Reference will now be made in detail to the preferred embodiments, examples of which are illustrated in the accompanying drawings.

Figure 1A:
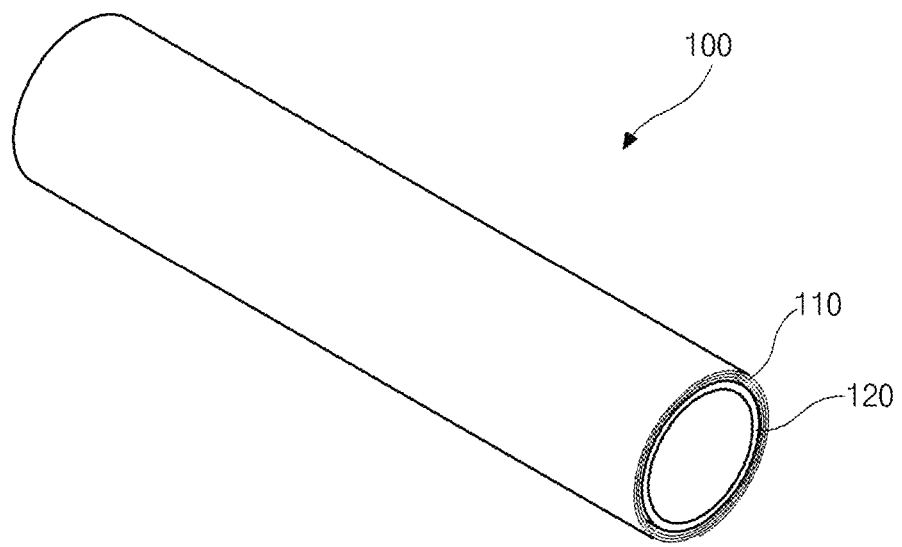
FIGS. 1A and 1B are perspective views showing a rollable display device according to a first embodiment of the present disclosure.
Figure 1B:
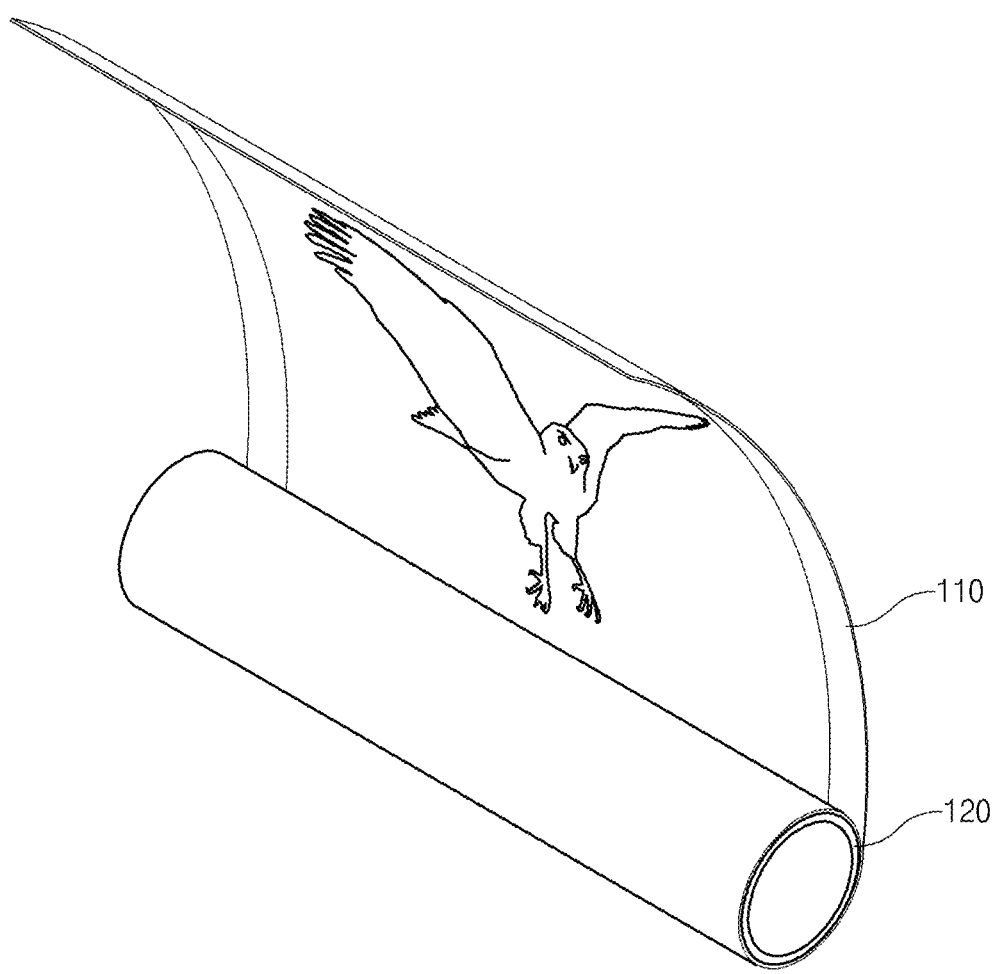

FIGS. 1A and 1B are perspective views showing a rollable display device according to a first embodiment of the present disclosure.

In FIGS. 1A and 1B, a rollable display device 100 includes a display panel 110 for displaying an image and a roller 120 where the display panel 110 is rolled.

The display panel 110 may include one of a liquid crystal display (LCD) device, a plasma display panel (PDP) device, an organic light emitting diode (OLED) display device and a field emission display (FED) device. For example, the display panel 110 may be the OLED display device as a flexible display device which keeps displaying an image even when bent like a paper.

Since a backlight unit for the LCD device of a non-emissive type is not required for the OLED display device of an emissive type, the OLED display device has a light weight and a thin profile. In addition, the OLED display device has advantages in a viewing angle, a contrast ratio and power consumption as compared with the LCD device. Further, the OLED display device can be driven with a low direct current (DC) voltage and has a rapid response speed. Moreover, since the inner elements of the OLED display device have a solid phase, the OLED display device has an excellent durability against an external impact and has a wide available temperature range. Specifically, since the OLED display device is fabricated through a simple process, the fabrication cost is reduced as compared with the LCD device.

The display panel 110 may include first and second substrates facing and spaced apart from each other and the first and second substrates may be attached using a protecting layer having an adhesive property.

Although not shown, the first and second substrates have a plurality of pixel regions in a display area. A driving thin film transistor may be formed in each pixel region on the first substrate. A first electrode connected to the driving thin film transistor is formed in each pixel region, and a light emitting layer emitting a colored light and a second electrode are sequentially formed on the first electrode. The light emitting layer emitting a light of red, green and blue colors may be formed by patterning an organic material. The first electrode, the light emitting layer and the second electrode may constitute a light emitting diode (LED). In addition, the first and second electrodes may function as an anode and a cathode, respectively.

The display panel 110 may have a non-display area surrounding the display area, and a plurality of lines and a plurality of driving chips for transmitting and generating driving signals and power signals are formed in the non-display area.

A printed circuit board (PCB) 130 (of FIG. 2A) electrically connected to the plurality of lines is attached to the non-display area of the display panel 110. The PCB 130 may be connected to an edge of the display panel 110 through a connecting means 140 (of FIG. 2B) such as a flexible printed circuit (FPC) or a tape carrier package (TCP).

In an OFF state where the display panel 110 does not display an image, as shown in FIG. 1A, the display panel 110 is rolled onto the roller 120. In an ON state where the display panel 110 displays an image, as shown in FIG. 1B, an end of the display panel 110 is unrolled from the roller 120 according to a user's demands.

The display panel 110 is rolled onto the roller 120 when the rollable display device 100 is not used and the display panel 110 is unrolled from the roller 120 when the rollable display device 100 is used. As a result, the rollable display device 100 has an advantage in a space application. In addition, since the rollable display device 100 has an ultra thin profile and a light weight, the rollable display device 100 has advantages in interior decoration and design.

Since the PCB 130 connected to the edge of the display panel 110 is disposed in the roller 120, an impact is not applied to the PCB 130 and a stress is not applied to the connecting means 140 between the PCB 130 and the display panel 110 when the display panel 110 is rolled onto the roller 120 and when the display panel 110 is unrolled from the roller 120. As a result, breakdown of a driving circuit on the PCB 130 and disconnection between the PCB 130 and the display panel 110 are prevented, thereby preventing deterioration of signals and improving reliability of the rollable display device 100.

Further, since the stress is not applied to the connecting means 140 between the PCB 130 and the display panel 110, an additional fixing means for fixing the PCB 130 to the display panel 110 is omitted. As a result, a fabrication process is simplified and fabrication cost is reduced, thereby improving fabrication efficiency.

Figure 2A:
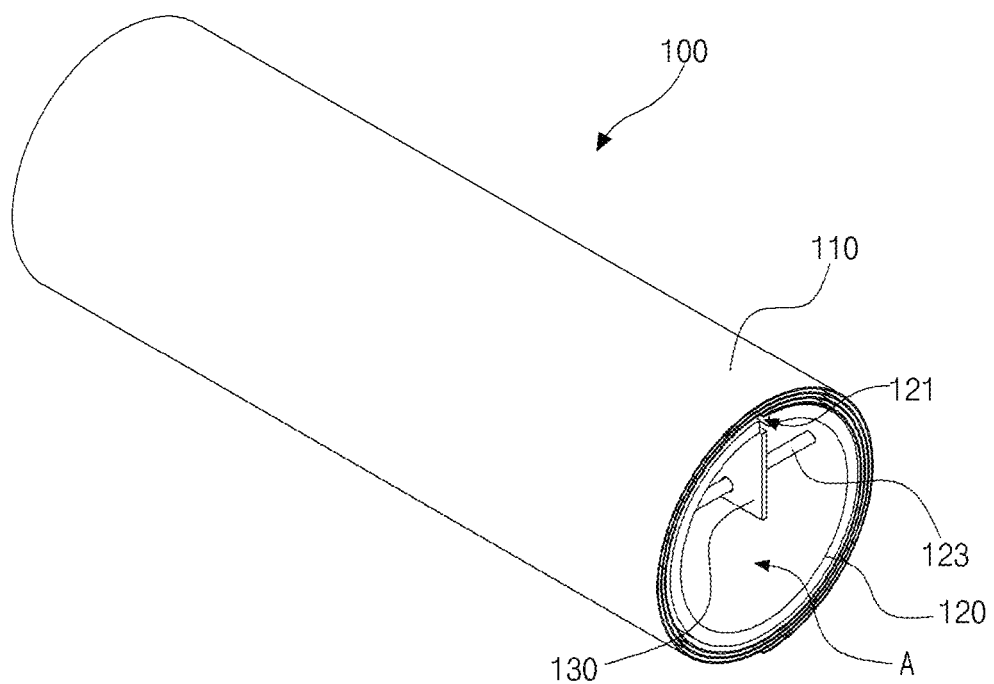
FIG. 2A is a magnified view of FIG. 1A.
Figure 2B:
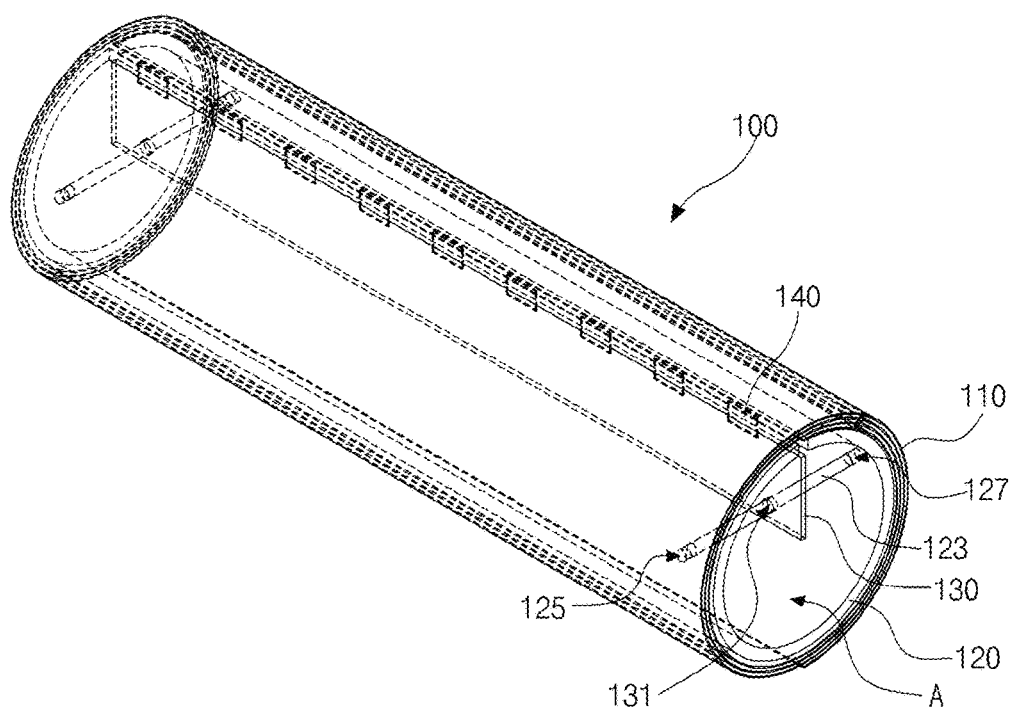
FIG. 2B is a projected view of FIG. 2A.
Figure 2C:
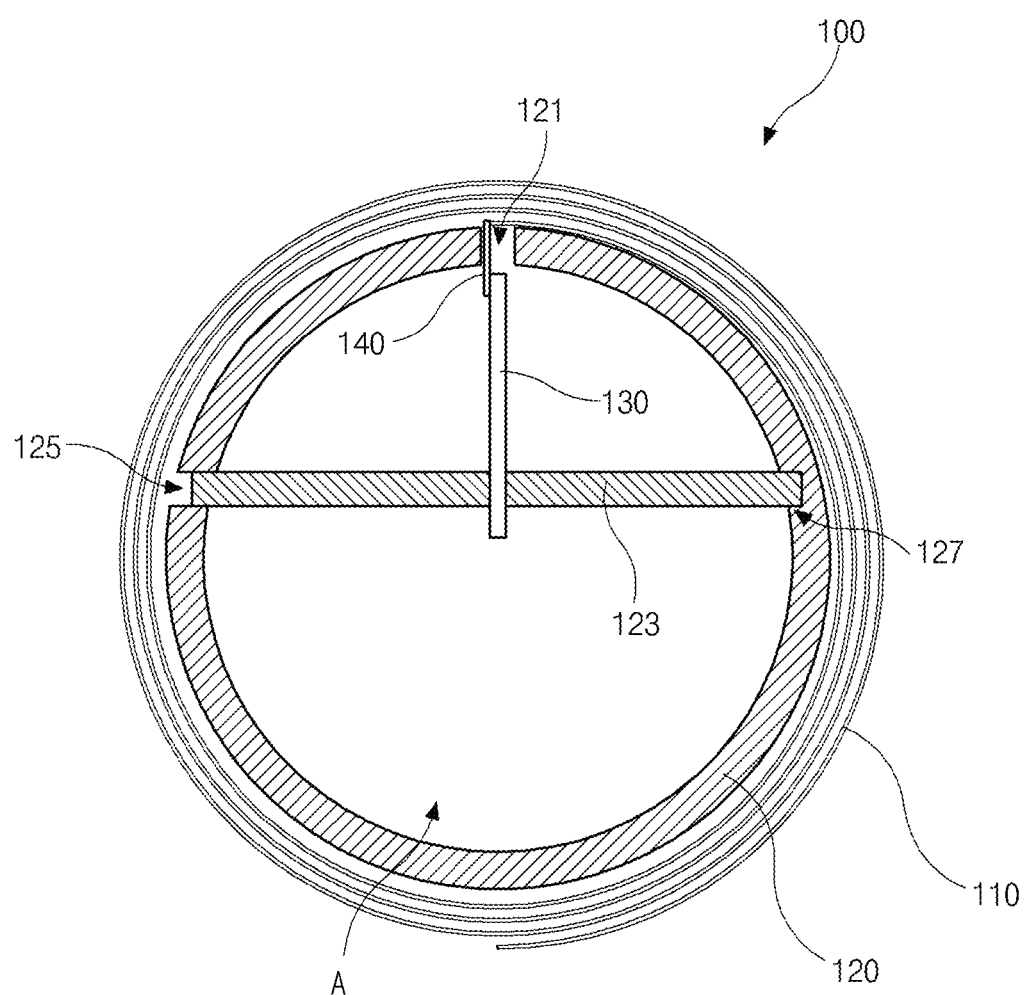
FIG. 2C is a cross-sectional view of FIG. 2A.

FIG. 2A is a magnified view of FIG. 1A, FIG. 2B is a projected view of FIG. 2A, and FIG. 2C is a cross-sectional view of FIG. 2A.

In FIGS. 2A to 2C, the roller 120 has a cylindrical shape having an inner space A, and the display panel 110 is rolled along an outer surface of the roller 120. A guide hole 121 exposing the inner space A is formed along a length direction of the roller 120. The edge of the display panel 110 where the PCB 130 is connected through the connecting means 140 is attached and fixed to the outer surface of the roller 120 adjacent to the guide hole 121 through an adhesive means 111 (of FIG. 3B) such as an adhesive resin or an adhesive double-sided tape, and the connecting means 140 and the PCB 130 is inserted into the guide hole 121 of the roller 120 to be disposed in the inner space A.

For example, an attaching area between the roller 120 and the display panel 110 may have a width greater than about 1 cm so that damage to the display panel 110 due to rotation of the roller 120 can be minimized when the display panel 110 is unrolled from the roller 120.

The PCB 130 is stably fixed in the inner space A of the roller 120 by at least one pin 123 inserted through at least one pin hole 131 of the PCB 130. For example, at least one pin hole 131 may be formed at both end portions of the PCB 130 along the length direction. Further, at least one through hole 125 where the at least one pin 123 may be inserted from the exterior may be formed in a portion of the roller 120, and at least one fixing groove 127 where an end of the at least one pin 123 through the at least one through hole 125 and the at least one pin hole 131 is fixed may be formed on an inner surface of the opposite portion of the roller 120.

As a result, when the PCB 130 inserted into the guide hole 121 is disposed in the inner space A of the roller 120, the at least one pin 123 inserted into the at least one through hole 125 of the roller 120 passes through the at least one pin hole 131 of the PCB 130 to cross the inner space A and is fixed to the at least one fixing groove 127 of the roller 120. Since a degree of freedom of the PCB 130 is restrained by the at least one pin hole 131 and the at least one hole 123, the PCB 130 is stably fixed in the inner space A.

When the display panel 110 is rolled onto or unrolled from the roller 120, an impact to the PCB 130 and a stress to the connecting means 140 between the PCB 130 and the display panel 110 are not applied. Accordingly, breakdown of a driving circuit on the PCB 130 and disconnection between the PCB 130 and the display panel 110 are prevented, thereby preventing deterioration of signals and improving reliability of the rollable display device 100.

In addition, since the stress is not applied to the connecting means 140 between the PCB 130 and the display panel 110, an additional fixing means for fixing the PCB 130 to the display panel 110 is omitted, and a connection process such as a tape automated bonding (TAB) process is applicable to the rollable display device 100 without modification. As a result, a fabrication process is simplified and fabrication cost is reduced, thereby improving fabrication efficiency.

Further, since the at least one pin 123 crossing the inner space A of the roller 120 is fixed to the at least one fixing groove 127, the position of the at least one pin 123 is fixed in the inner space A of the roller 120, and the PCB 130 is more stably fixed in the inner space A of the roller 120.

FIGS. 3A to 3F are views showing a method of fabricating a rollable display device according to a first embodiment of the present invention.

Figure 3A:
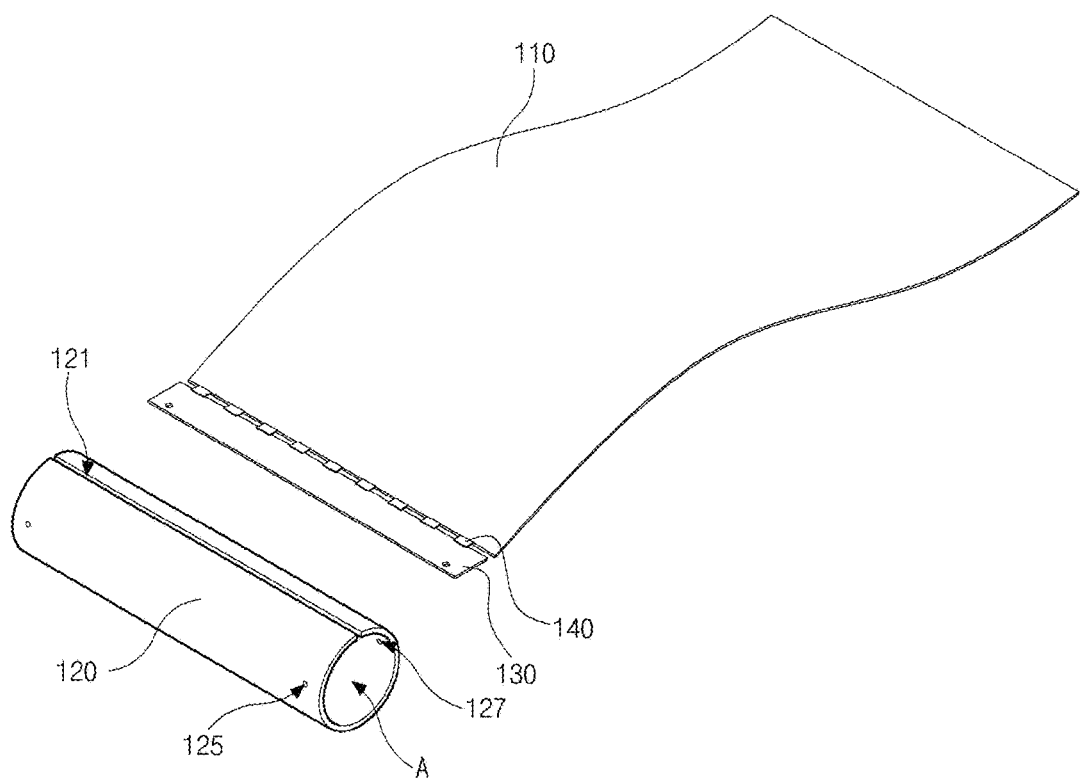
FIGS. 3A to 3F are views showing a method of fabricating a rollable display device according to a first embodiment of the present invention.

In FIG. 3A, the rollable display device 100 includes the display panel 110 for displaying an image and the roller 120 where the display panel 110 is rolled. The roller 120 has a cylindrical shape having an inner space A, and the guide hole 121 exposing the inner space A is formed along a length direction of the roller 120. In addition, the at least one through hole 125 exposing the inner space A is formed in a portion of the roller 120 and the at least one fixing groove 127 is formed on the inner surface of the opposite portion of the roller 120.

The PCB 130 is connected to the edge of the flexible display panel 110 through the connecting means 140, and the at least one pin hole 131 (of FIG. 2B) is formed at both end portions of the PCB 130 along the length direction.

Figure 3B:
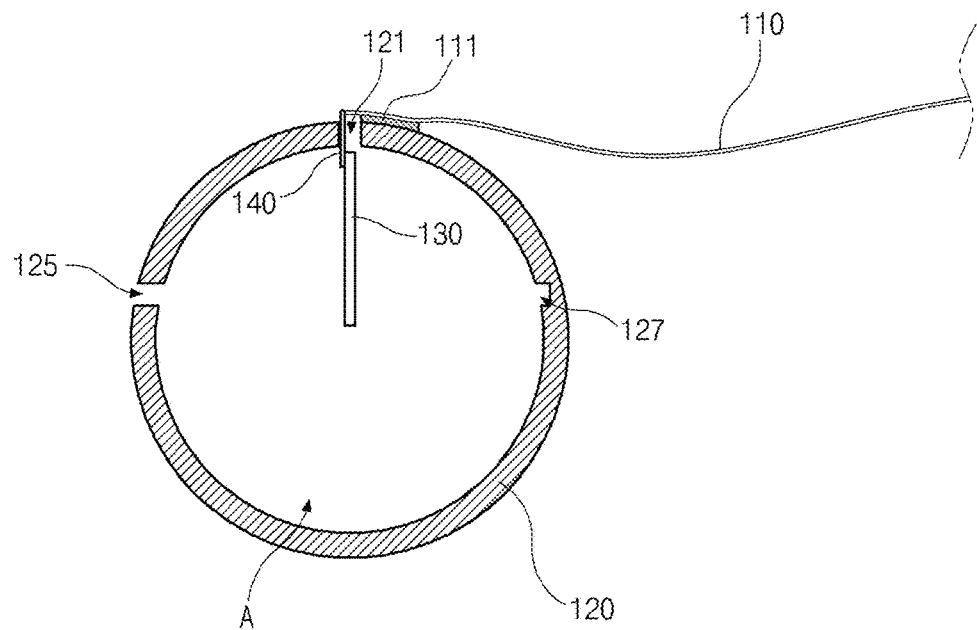

In FIG. 3B, after the PCB 130 and the connecting means 140 are inserted into the guide hole 121 of the roller to be disposed in the inner space A of the roller 120, the edge of the display panel 110 where the connecting means 140 is connected is fixed and attached to the outer surface of the roller 120 adjacent to the guide hole 121 through the adhesive means 111 such as an adhesive resin or an adhesive double-sided tape.

Figure 3C:
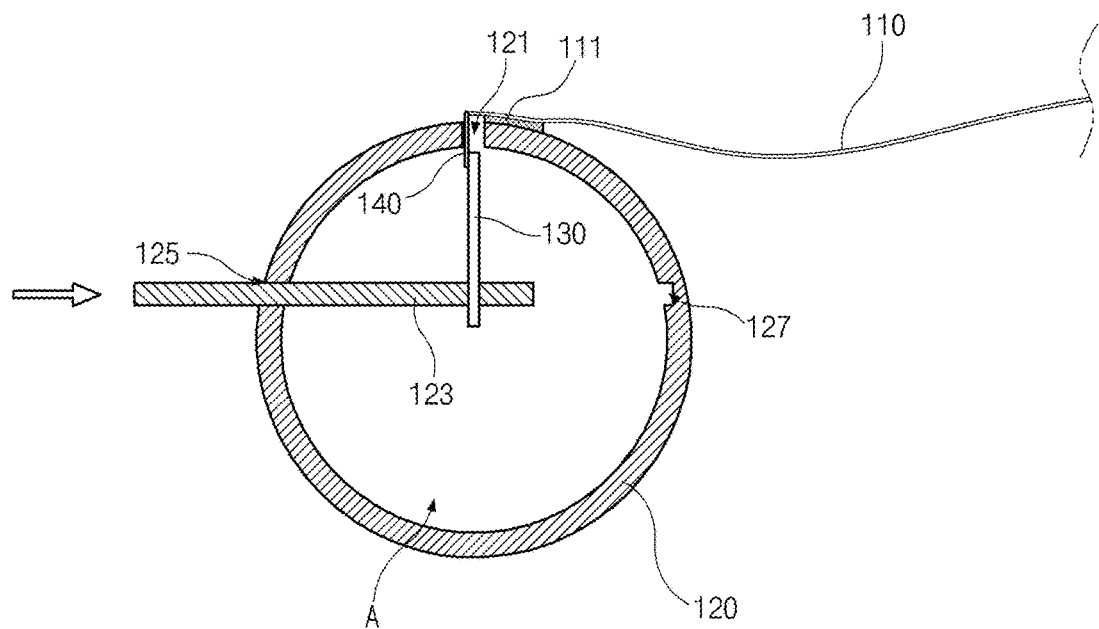

In FIG. 3C, the at least one pin 123 is inserted into the at least one through hole 125 from the exterior to cross the inner space A of the roller 120.

Figure 3D:
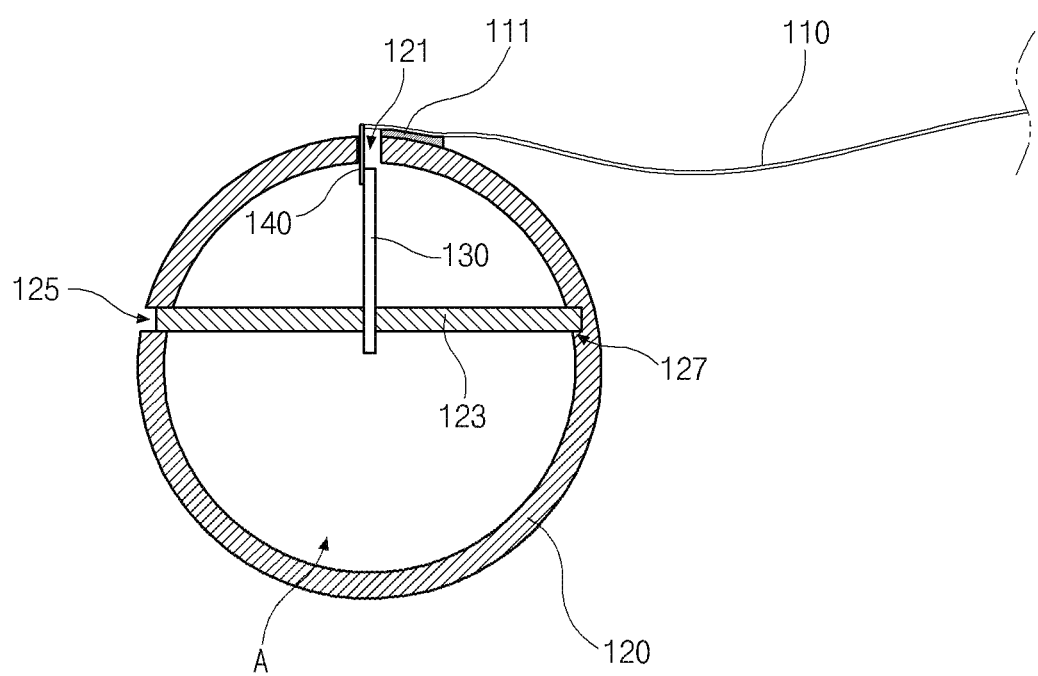

In FIG. 3D, the end of the at least one pin 123 through the at least one through hole 125 and the at least one pin hole 131 is fixed to the at least one fixing groove 127, so that the PCB 130 is stably fixed in the inner space A of the roller 120. As a result, an impact to the PCB 130 and a stress to the connecting means 140 between the PCB 130 and the display panel 110 are not applied even when the display panel 110 is rolled onto or unrolled from the roller 120. Accordingly, breakdown of a driving circuit on the PCB 130 and disconnection between the PCB 130 and the display panel 110 are prevented, thereby preventing deterioration of signals and improving reliability of the rollable display device 100.

In addition, since the stress is not applied to the connecting means 140 between the PCB 130 and the display panel 110, an additional fixing means for fixing the PCB 130 to the display panel 110 is omitted, and a connection process such as a tape automated bonding (TAB) process is applicable to the rollable display device 100 without modification. As a result, a fabrication process is simplified and fabrication cost is reduced, thereby improving fabrication efficiency.

Figure 3E:
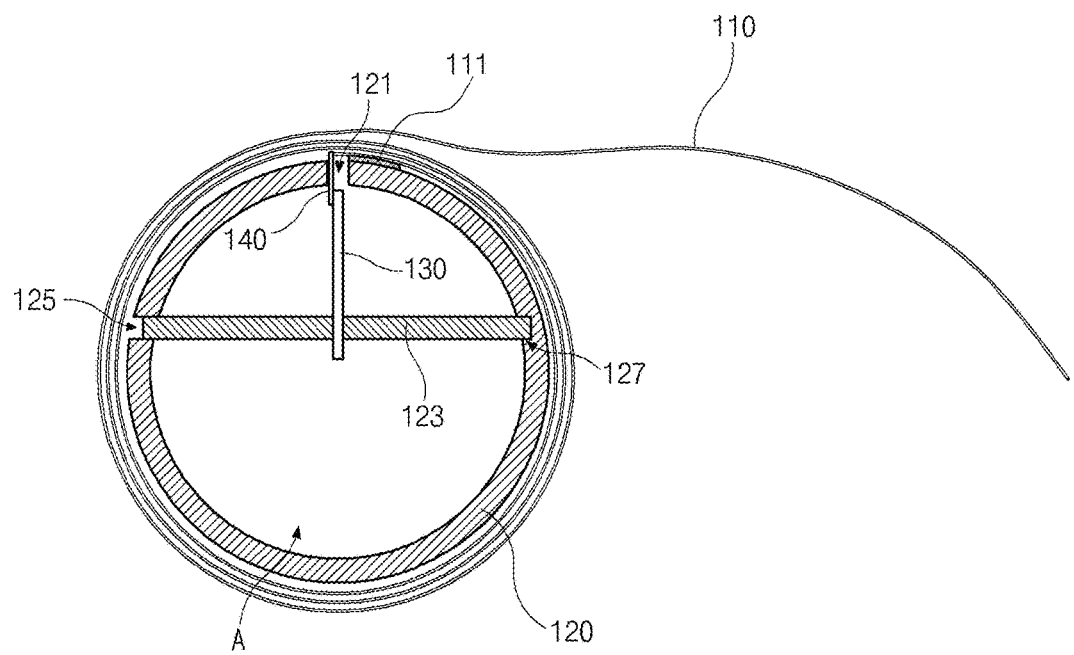

In FIG. 3E, the display panel 110 is rolled onto the roller 120.

Figure 3F:
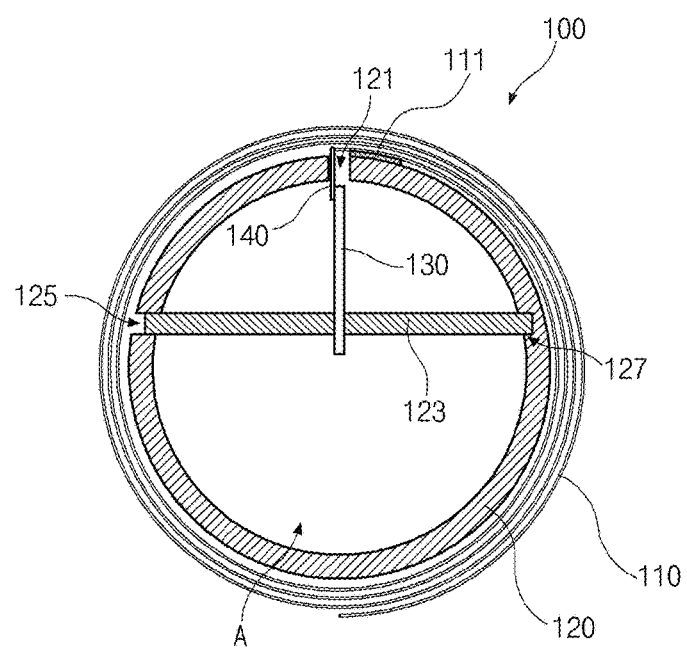

In FIG. 3F, the display panel 110 is completely rolled onto the roller 120 and the fabrication process of the rollable display device 100 is completed.

In the rollable display device 100 according to the first embodiment of the present disclosure, the display panel 110 is rolled onto the roller 120 when the rollable display device 100 is not used and the display panel 110 is unrolled from the roller 120 when the rollable display device 100 is used. As a result, the rollable display device 100 has an advantage in a space application. In addition, since the rollable display device 100 has an ultra thin profile and a light weight, the rollable display device 100 has advantages in interior decoration and design.

Specifically, since the PCB 130 is stably fixed in the inner space A of the roller 120, application of an impact to the PCB 130 and a stress to the connecting means 140 between the PCB 130 and the display panel 110 is prevented even when the display panel 110 is rolled onto or unrolled from the roller 120. Accordingly, breakdown of a driving circuit on the PCB 130 and disconnection between the PCB 130 and the display panel 110 are prevented, thereby preventing deterioration of signals and improving reliability of the rollable display device 100.

Figure 4A:
FIGS. 4A and 4B are views showing a rollable display device according to a second embodiment of the present disclosure.
Figure 4B:
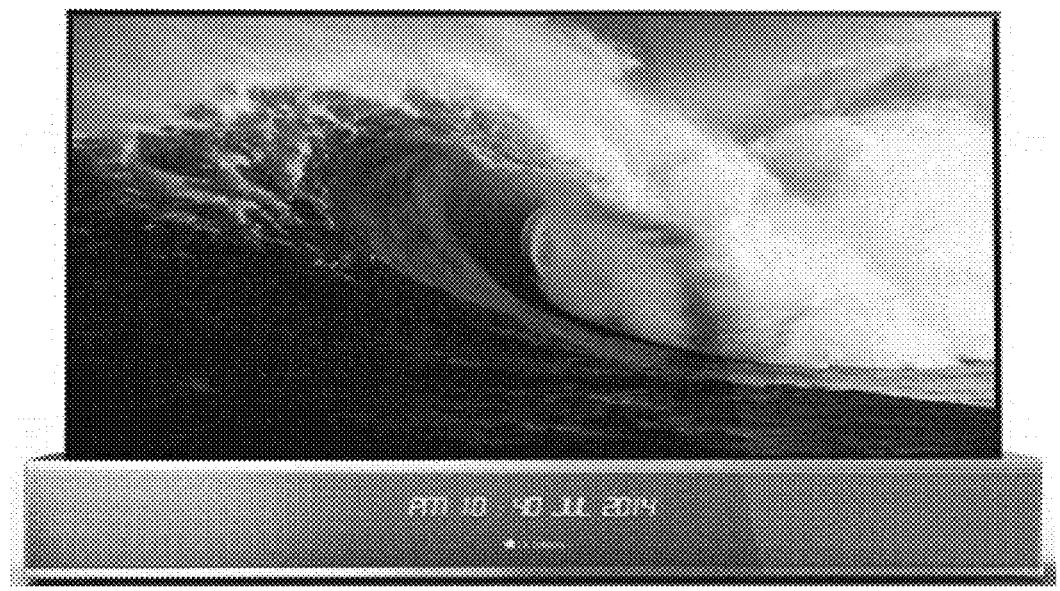

FIGS. 4A and 4B are views showing a rollable display device according to a second embodiment of the present disclosure.

In an OFF state where a display panel does not display an image, as shown in FIG. 4A, the display panel rolled onto a roller is disposed in a case. In an ON state where the display panel displays an image, as shown in FIG. 4B, a first side of the display panel is pulled upwardly from the case and the display panel is automatically spread out. Accordingly, the rollable display device has advantages in a space application. In addition, since the rollable display device has an ultra thin profile and a light weight, the rollable display device has advantages in interior decoration and design.

In the rollable display device, the display panel is spread out upwardly, and the case may be disposed on a bottom of a user's space. Since it is not necessary to install the rollable display device on a ceiling or a sidewall, the rollable display device may create a fine view to have an excellent effect in interior decoration and design. The installation of the rollable display device on the ceiling or the sidewall may be difficult and may require an expensive cost. Since the rollable display device is installed on the bottom, an additional installation is omitted and installation cost is reduced. Further, since the rollable display device has an ultra thin profile and a light weight, it is simple and easy to move and keep the rollable display device. Specifically, since the display panel is fully automatically rolled onto and unrolled from the roller, convenience of a user is improved.

Figure 5A:
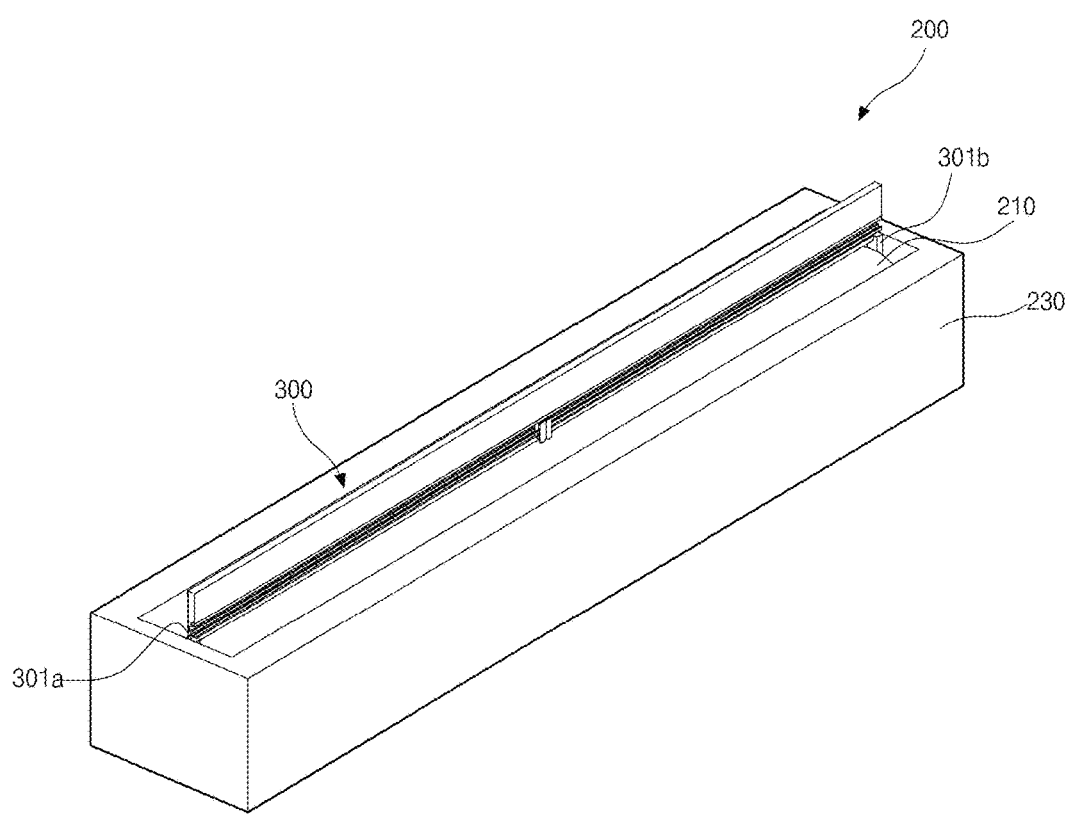
FIGS. 5A and 5B are perspective views showing a rollable display device in an OFF state and an ON state, respectively, according to a second embodiment of the present disclosure.
Figure 5B:
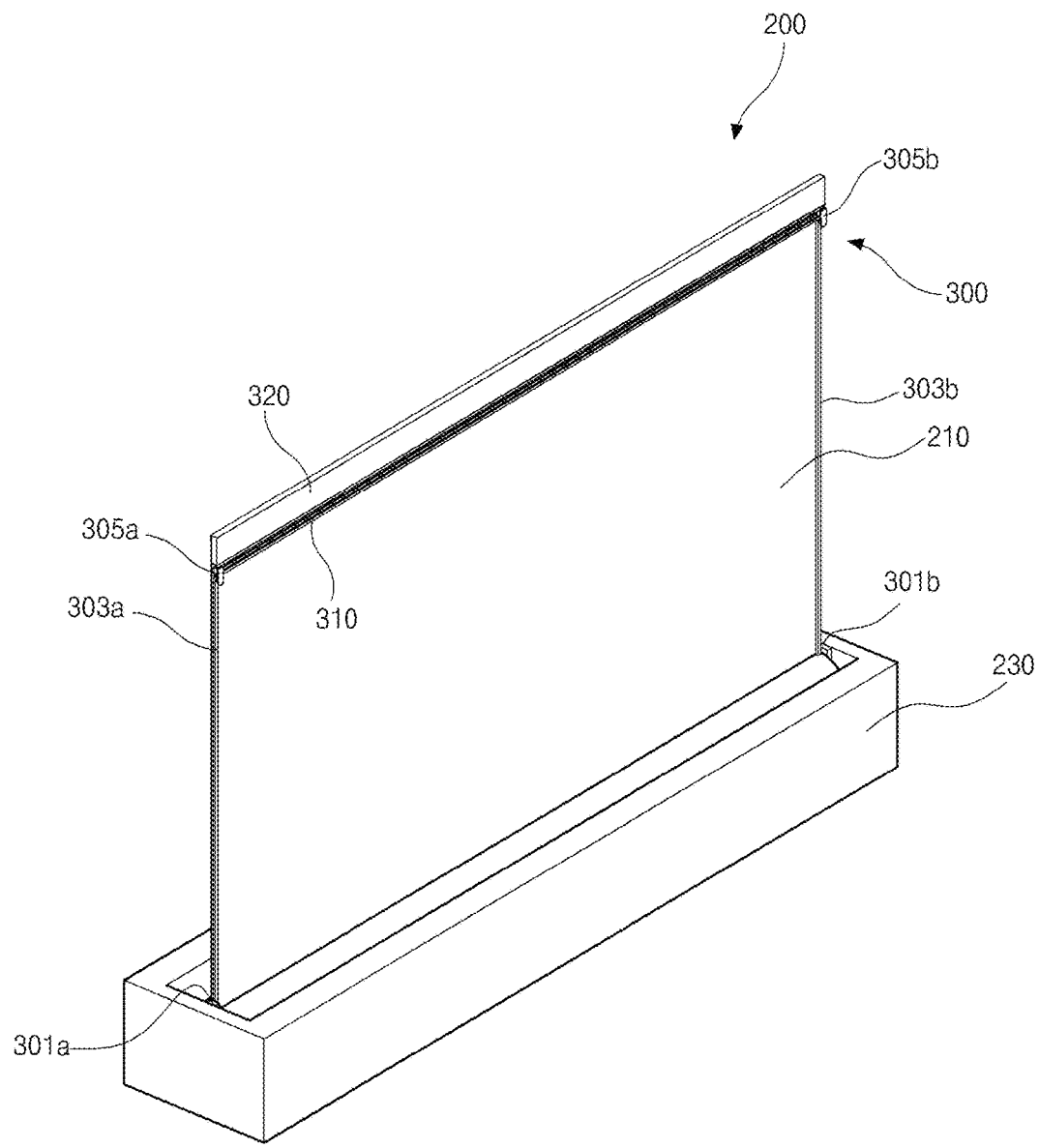

FIGS. 5A and 5B are perspective views showing a rollable display device in an OFF state and an ON state, respectively, according to a second embodiment of the present disclosure.

In FIGS. 5A and 5B, a rollable display device 200 includes a display panel 210 displaying an image, a roller 220 (of FIG. 6A) where the display panel 210 is rolled, a driving unit 300 for rolling and unrolling the display panel 210 and a case 230 accommodating the roller 220. In an OFF state of the rollable display device 200, the display panel 210 is pulled downwardly into the case 230 and is rolled onto the roller 220. In an ON state of the rollable display device 200, the display panel 210 is unrolled from the roller 220 and is pulled upwardly from the case 230.

The display panel 210 may include one of a liquid crystal display (LCD) device, a plasma display panel (PDP) device, an organic light emitting diode (OLED) display device and a field emission display (FED) device. For example, the display panel 210 may be the OLED display device as a flexible display device which keeps displaying an image even when bent like a paper.

Since a backlight unit for the LCD device of a non-emissive type is not required for the OLED display device of an emissive type, the OLED display device has a light weight and a thin profile. In addition, the OLED display device has advantages in a viewing angle, a contrast ratio and power consumption as compared with the LCD device. Further, the OLED display device can be driven with a low direct current (DC) voltage and has a rapid response speed. Moreover, since the inner elements of the OLED display device have a solid phase, the OLED display device has an excellent durability against an external impact and has a wide available temperature range. Specifically, since the OLED display device is fabricated through a simple process, the fabrication cost is reduced as compared with the LCD device.

The display panel 210 may include first and second substrates facing and spaced apart from each other and the first and second substrates may be attached using a protecting layer having an adhesive property.

Although not shown, the first and second substrates have a plurality of pixel regions in a display area. A driving thin film transistor may be formed in each pixel region on the first substrate. A first electrode connected to the driving thin film transistor is formed in each pixel region, and a light emitting layer emitting a colored light and a second electrode are sequentially formed on the first electrode. The light emitting layer emitting a light of red, green and blue colors may be formed by patterning an organic material. The first electrode, the light emitting layer and the second electrode may constitute a light emitting diode (LED). In addition, the first and second electrodes may function as an anode and a cathode, respectively.

The display panel 210 may have a non-display area surrounding the display area, and a plurality of lines and a plurality of driving chips for transmitting and generating driving signals and power signals are formed in the non-display area.

Although not shown, a printed circuit board (PCB) electrically connected to the plurality of lines is attached to the non-display area of the display panel 210. The PCB may be connected to an edge of the display panel 210 through a connecting means such as a flexible printed circuit (FPC) or a tape carrier package (TCP).

In an OFF state where the display panel 210 does not display an image, as shown in FIG. 5A, the display panel 210 rolled onto the roller 220 is pulled downwardly to be disposed in the case 230. In an ON state where the display panel 210 displays an image, as shown in FIG. 5B, the display panel 210 unrolled from the roller 220 is pulled upwardly to be spread outside the case 230. The display panel 210 is fully automatically rolled onto and unrolled from the roller 220 by the driving unit 300 to have one of the OFF and ON states. In the rollable display device 200, since the display panel 210 is easily rolled onto and unrolled from the roller 220 according to one of the OFF and ON states, convenience of a user is improved.

The driving unit 300 may include first and second motors 301a and 301b, first and second links 303a and 303b, a rail unit 310 and a fixing bracket 320. The first and second motors 301a and 301b may generate a rotational force, and the first and second links 303a and 303b may move by the rotational force of the first and second motors 301a and 301b, respectively. For example, one end of each of the first and second links 303a and 303b may be connected to each of the first and second motors 301a and 301b, and the other end of each of the first and second links 303a may rotate with respect to the one end. The first and second links 303a and 303b may be connected to the rail unit 310 through first and second rotational links 305a and 305b, respectively. The fixing bracket 320 may be connected to the rail unit 310 to fix a first side of the display panel 210.

The rail unit 310 may include a guide rail 311 (of FIG. 6A) having a length corresponding to a first side of the display panel 210, and first and second guide brackets 313a and 313b (of FIG. 6B) moving along the guide rail 311. The first and second guide brackets 313a and 313b are connected to the first and second links 303a and 303b through the first and second rotational links 305a and 305b, respectively. In addition, each of the first and second links 303a and 303b may have a length corresponding a half of the first side of the display panel 210.

The one ends of the first and second links 303a and 303b may be disposed at end portions, respectively, of the case 230 along a length direction. The other ends of the first and second links 303a and 303b may be disposed to face each other or may circularly move by the rotational force of the first and second motors 301a and 301b to push the rail unit 310 and the fixing bracket 320 upwardly.

Since the rail unit 310 and the fixing bracket 320 are pushed upwardly, the first side of the display panel 210 fixed to the fixing bracket 320 is pulled upwardly and the display panel 210 is spread outwardly. When the display panel 210 is spread, the first and second links 303a and 303b support second and third sides, respectively, perpendicular to the first side of the display panel 210.

As a result, in the rollable display device 200 according to the second embodiment of the present disclosure, the display panel 210 rolled onto the roller 220 is disposed in the case 230 in the OFF state, and the display panel 210 is pulled upwardly from the case 230 and displays an image in the ON state according to a user's demands. Specifically, since the display panel 210 is fully automatically rolled onto and unrolled from the roller 220, convenience of a user is further improved.

Figure 6A:
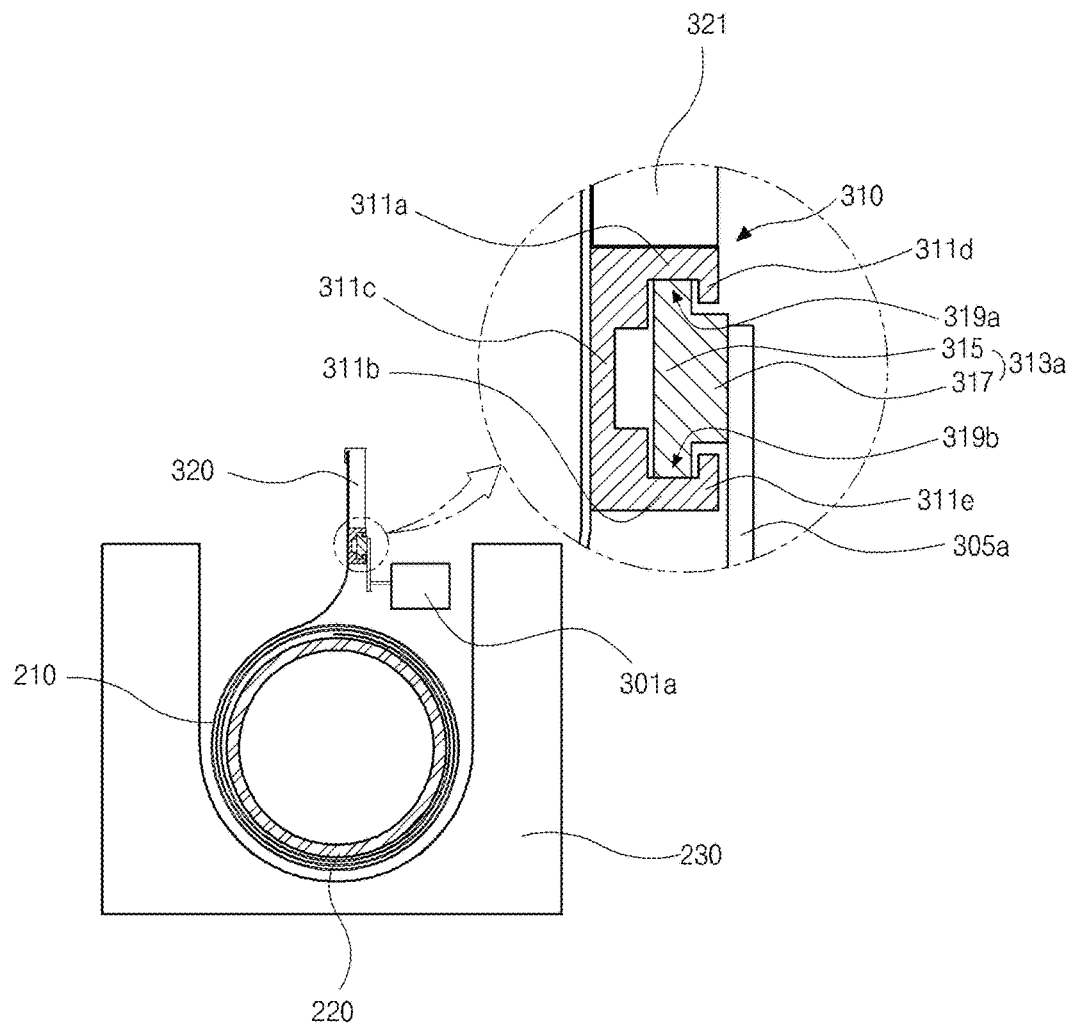
FIG. 6A is a cross-sectional view showing a rollable display device in an OFF state according to a second embodiment of the present disclosure.
Figure 6B:
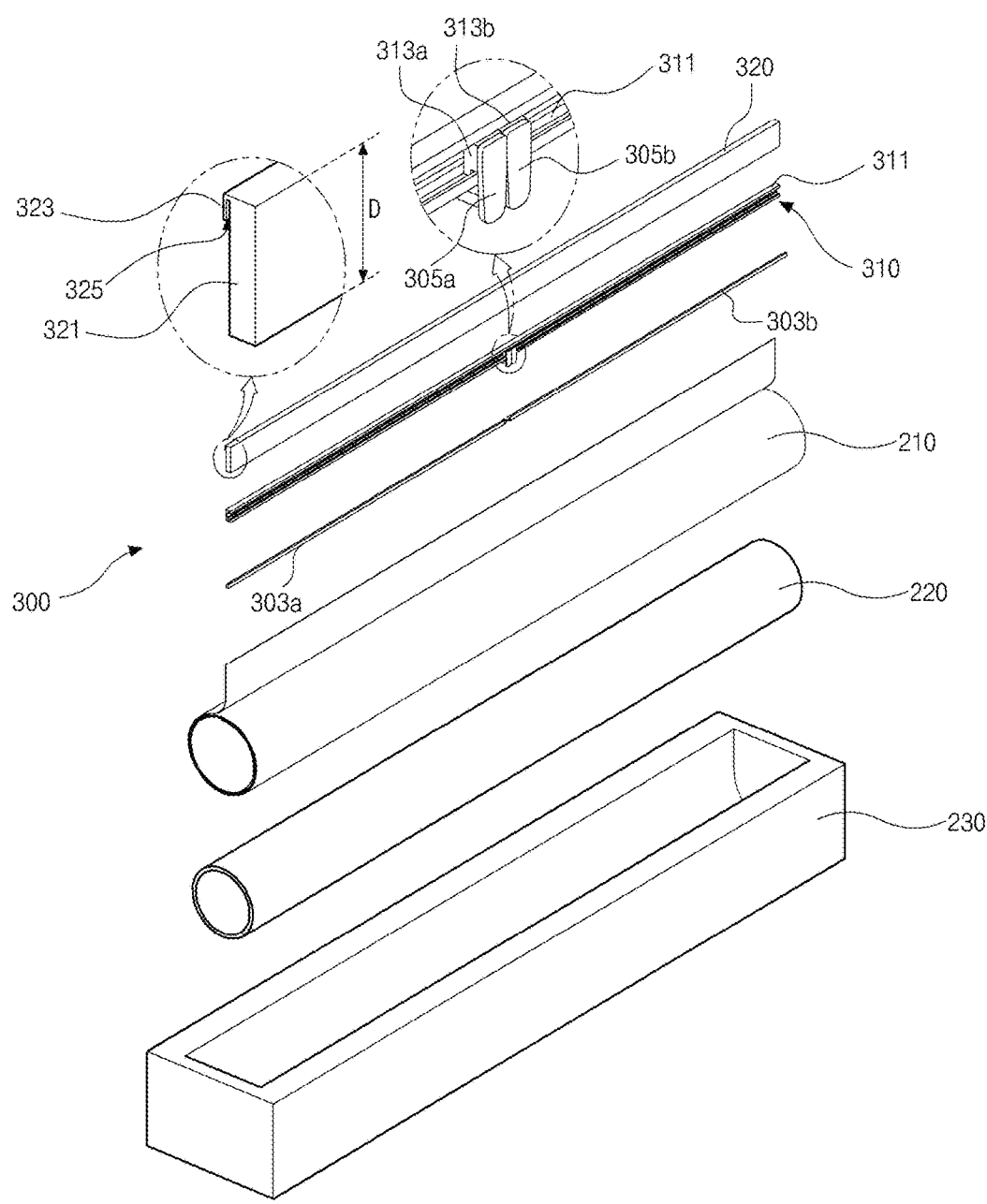
FIG. 6B is an exploded perspective view of FIG. 6A.
Figure 6C:
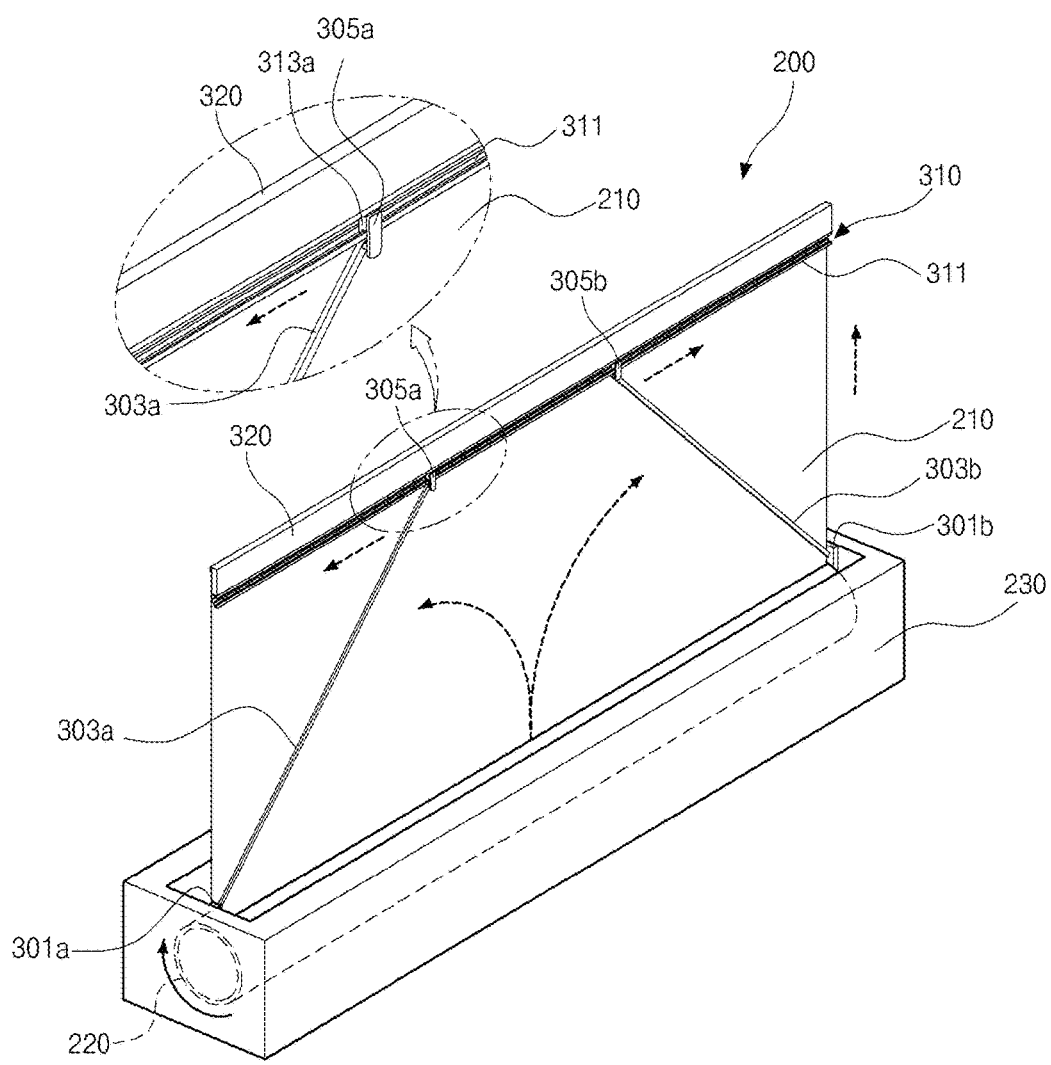
FIG. 6C is a perspective view showing a rollable display device changing from an OFF state to an ON state according to a second embodiment of the present disclosure.
Figure 6D:
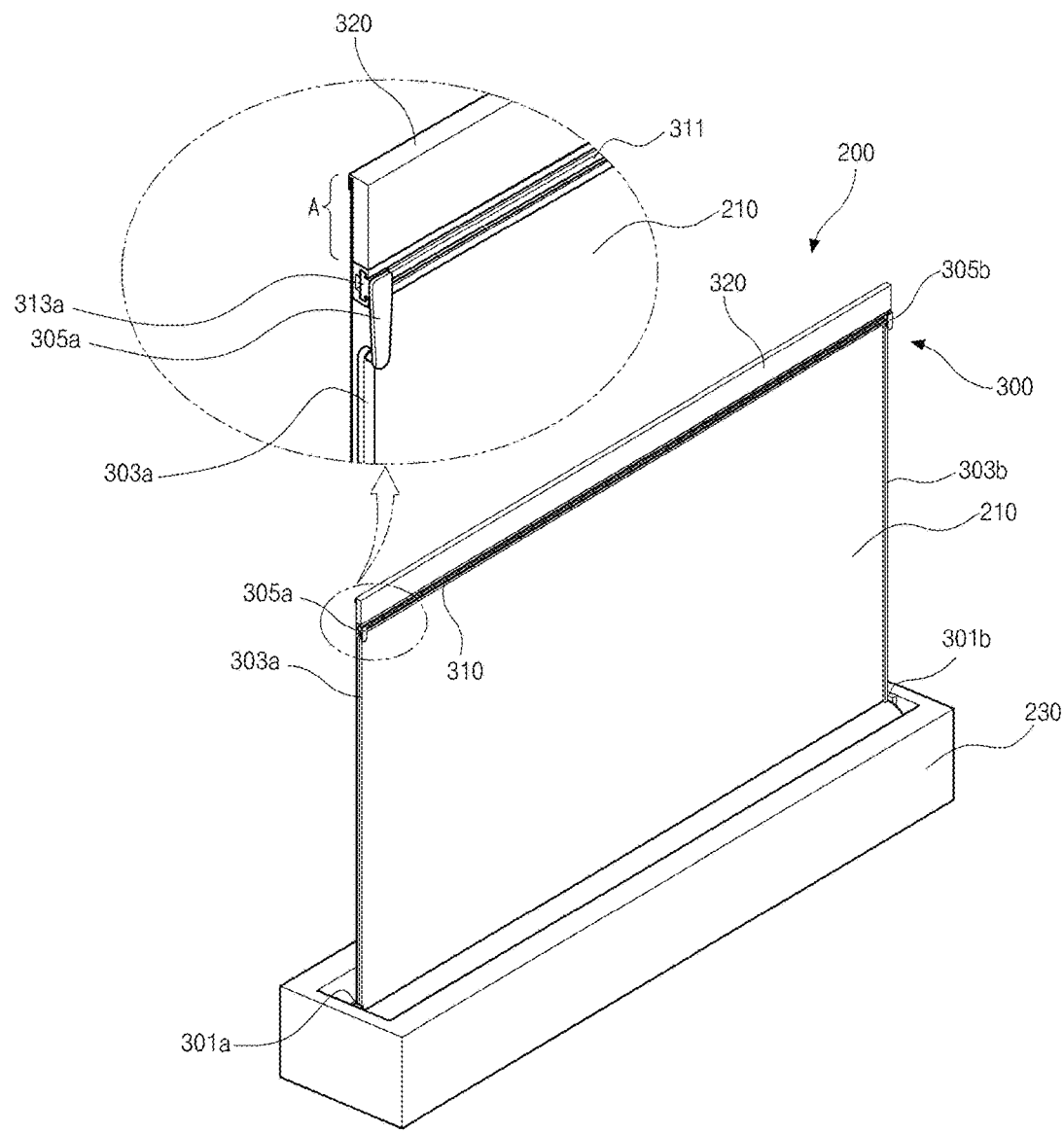
FIG. 6D is a perspective view showing a rollable display device in an ON state according to a second embodiment of the present disclosure.

FIG. 6A is a cross-sectional view showing a rollable display device in an OFF state according to a second embodiment of the present disclosure and FIG. 6B is an exploded perspective view of FIG. 6A. FIG. 6C is a perspective view showing a rollable display device changing from an OFF state to an ON state according to a second embodiment of the present disclosure and FIG. 6D is a perspective view showing a rollable display device in an ON state according to a second embodiment of the present disclosure.

In FIGS. 6A and 6B, the rollable display device 200 includes the display panel 210, the roller 220, the driving unit 300 and the case 230. The display panel 210 is rolled onto the roller 220 and a first side of the display panel 210 is fixed to the fixing bracket 320 of the driving unit 300.

The driving unit 300 includes the first and second motors 301a and 301b, the first and second links 303a and 303b, the rail unit 310 and the fixing bracket 320. The first and second motors 301a and 301b generate a rotational force, and the first and second links 303a and 303b move by the rotational force of the first and second motors 301a and 301b, respectively. For example, first ends of the first and second links 303a and 303b may be connected to the first and second motors 301a and 301b, respectively, and the other ends of the first and second links 303a may rotate with respect to the first ends. The first and second links 303a and 303b are connected to the rail unit 310 through first and second rotational links 305a and 305b, respectively. The fixing bracket 320 is connected to the rail unit 310 to fix the first side of the display panel 210.

The first side of the display panel 210 is fixed to the fixing bracket 320 and the fourth side opposite to the first side of the display panel 210 is fixed to the roller 220. The fixing bracket 320 may include a supporting portion 321 supporting a rear surface of the first side of the display panel 210 and a fixing portion 323 protruding from one end of the supporting portion 321 toward a front of the display panel 210 where an image is displayed. The fixing portion 323 may include an inserting hole 325 into which the first side of the display panel 210 is inserted. The fixing bracket 320 may have a length corresponding to the first side of the display panel 210.

The rail unit 310 is disposed under the fixing bracket 320 on the rear surface of the display panel 210, and the guide rail 311 of the rail unit 310 is connected and fixed to the other end of the supporting portion 321 of the fixing bracket 320. The guide rail 311 may have a length corresponding to the first side of the display panel 210, and the first and second guide brackets 313a and 313b are connected to the guide rail 311 to move along the guide rail 311.

The guide rail 311 having a "U" shape in cross-sectional view may include a first guide portion 311a connected to the other end of the supporting portion 321 of the fixing bracket 320, a second guide portion 311b facing and parallel to the first guide portion 311a and a connecting portion 311c interconnecting the first and second guide portions 311a and 311b and perpendicular to the first and second guide portions 311a and 311b. In addition, third and fourth guide portions 311d and 311e are perpendicularly extend from the other ends of the first and second guide portions 311a and 311b, respectively, to constitute an opening of the guide rail 311.

Each of the first and second guide brackets 313a and 313b may include a vertical guide portion 315 facing the connecting portion 311c and a horizontal guide portion 317 protruding from the vertical guide portion 315 toward the opening of the guide rail 311.

First and second guide holes 319a and 319b are formed in inner surfaces of the first and second guide portions 311a and 311b, respectively, and both ends of the vertical guide portion 315 of each of the first and second guide brackets 313a and 313b along a vertical direction are inserted into the first and second guide holes 319a and 319b, respectively.

The first and second guide brackets 313a and 313b move along the guide rail 311 with both ends of the vertical guide portion 315 inserted into the first and second guide holes 319a and 319b of the guide rail 311. As a result, the first and second guide brackets 313a and 313b have a linear motion along a length direction of the guide rail 311.

In the OFF state, as shown in FIG. 6B, the first and second guide brackets 313a and 313b are disposed at a central portion of the guide rail 311.

First ends of the first and second rotational links 305a and 305b are fixed to the vertical guide portions 317 of the first and second guide brackets 313a and 313b, respectively, and the first and second rotational links 305a and 305b are rotatably connected to the first and second links 303a and 303b, respectively, under the rail unit 310.

Each of the first and second links 303a and 303b may have a length corresponding to half of the first side of the display panel 210. The first ends of the first and second links 303a and 303b may be connected to the first and second motors 301a and 301b, respectively, and the other ends of the first and second links 303a and 303b may face each other.

First ends of the first and second rotational links 305a and 305b are fixed to the first and second guide brackets 313a and 313b, respectively, at the central portion of the guide rail 311, and the other ends of the first and second rotational links 305a and 305b are rotatably connected to the other ends of the first and second links 303a and 303b, respectively. The other ends of the first and second rotational links 305a and 305b are rotatable with respect to the other ends of the first and second links 303a and 303b, respectively.

The first and second links 303a and 303b have a rotational motion. When the rotational force of the first and second motors 301a and 301b is transferred to the first and second links 303a and 303b, respectively, the first and second links 303a and 303b rotate with respect to the one ends thereof clockwise or counterclockwise. As a result, the other ends of the first and second links 303a and 303b move along curves (circular arc) corresponding to the rotational motion. In addition, the first and second rotational links 305a and 305b connected to the other ends of the first and second links 303a and 303b rotate according to the rotational motion of the first and second links 303a and 303b.

The rotational force of the first and second links 303a and 303b is transferred to the first and second guide brackets 313a and 313b through the first and second rotational links 305a and 305b, respectively. As a result, the first and second guide brackets 313a and 313b move from the central portion to opposite end portions of the guide rail 311 along the length direction of the guide rail 311. The first and second guide brackets 313a and 313b have a linear motion opposite to each other due to the rotational force of the first and second links 303a and 303b.

Accordingly, the rail unit 310 and the fixing bracket 320 are pushed upwardly due to the rotational force of the first and second links 303a and 303b and the linear force of the first and second guide brackets 313a and 313b. As the rail unit 310 and the fixing bracket 320 are pushed upwardly, the display panel 210 fixed to the fixing bracket 320 is pushed upwardly to be unrolled from the roller 220.

When the first and second links 303a and 303b are disposed perpendicular to the length direction of the display panel 210, operation of the first and second motors 301a and 301b stops so that the rollable display device 200 can have the ON state as shown in FIG. 6D. In the ON state, the first and second links 303a and 303b may support the second and third sides, respectively, perpendicular to the first side of the display panel 210. Accordingly, stiffness of the display panel 210 when fully spread out is improved.

Although not shown, a torque motor coupled with the first and second motors 301a and 301b may be formed in the roller 220. When the first and second motors 301a and 301b operate, the torque motor may operate to correspond to the operation of the first and second motors 301a and 301b. As a result, while the display panel 210 is unrolled from the roller 220, the roller 220 rotates due to the torque motor. Since the roller 220 rotates in addition to the rotational force of the first and second links 303a and 303b and the linear force of the first and second guide brackets 313a and 313b pushing the rail unit 310 and the fixing bracket 320 upwardly, the display panel 210 may be further easily pulled upwardly and may be further easily spread out.

In the rollable display device 200, the display panel 210 may have an aspect ratio of 4:3 or 16:9, and each of the first and second links 303a and 303b may have a length corresponding to half of the first side of the display panel 210. As a result, when the display panel 210 of an aspect ratio of 16:9 has the first side of 16 and the second and third sides of 9, each of the first and second links 303a and 303b has a length of 8 (=16/2). Since the length of each of the first and second links 303a and 303b is shorter than each of the second and third sides of the display panel 210, the first and second links 303a and 303b may not completely support the second and third sides of the display panel 210 and the display panel 210 may not be fully spread out. For the purpose of preventing the incomplete spread of the display panel 210, in the rollable display device 200 according to the second embodiment of the present invention, the fixing bracket 320 fixing the first side of the display panel 210 supports a residual region A of the display panel 210 which is not supported by the first and second links 303a and 303b.

For example, the supporting portion 321 of the fixing bracket 320 may have a height D corresponding to the residual region A which is not supported by the first and second links 303a and 303b. In addition, the first side of the display panel 210 may be inserted into the inserting hole 325 formed in the fixing portion 323 protruding from one end of the supporting portion 321. As a result, a length of each of the second and third sides of the display panel 210 may correspond to a sum of the height D of the supporting portion and a length of each of the first and second links 303a and 303b. Since the fixing bracket 320 may support and fix the residual region A, the display panel 210 may be fully spread out.

Further, although not shown, the display panel 210 and the roller 220 of the second embodiment may have the same structure as the display panel 110 and the roller 120 of the first embodiment. For example, a printed circuit board (PCB) may be connected to a fourth side opposite to the first side of the display panel 210 through a connecting means. In addition, the roller 220 may have a guide hole, a through hole and a fixing groove, and the PCB may have a pin hole. The PCB and the connecting means may be inserted into the guide hole and a pin may be inserted into the through hole and the pin hole to be fixed to the fixing groove, thereby stably fixing the PCB in the roller 220.

Consequently, in the rollable display device 200 according to the second embodiment of the present invention, the display panel 210 is rolled onto the roller 220 and is disposed in the case 230 in the OFF state where the display panel 210 does not display an image. In addition, the display panel 210 is pulled upwardly from the case 230 and is automatically spread out in the ON state where the display panel 210 displays an image. Accordingly, the rollable display device 200 has advantages in a space application. Further, since the rollable display device 200 has an ultra thin profile and a light weight, the rollable display device 200 has advantages in interior decoration and design.

Moreover, the display panel 210 is spread out upwardly, and the case 230 may be disposed on a bottom of a user's space. Since it is not necessary to install the rollable display device 200 on a ceiling or a sidewall, the rollable display device 200 may create a fine view to have an excellent effect in interior decoration and design. The installation of the rollable display device 200 on the ceiling or the sidewall may be difficult and may require an expensive cost. Since the rollable display device 200 is installed on the bottom, an additional installation is omitted and installation cost is reduced.

Furthermore, since the rollable display device 200 has an ultra thin profile and a light weight, it is simple and easy to move and keep the rollable display device 200. Specifically, since the display panel 210 is fully automatically rolled onto and unrolled from the roller 220, convenience of a user is improved.

In a method of providing a display, the flexible display panel 110, 210 is provided and configured to produce an image. A portion of the flexible display panel 110, 210 is elevated to unfurl the flexible display panel 110, 210. One manner of unfurling the flexible display panel 110, 210 is by unrolling the flexible display panel 110, 210 during the elevating of the portion of the flexible display panel 110, 210. The flexible display panel 110, 210 may be unrolled from a housing/case 230 by elevating one end of the flexible display panel 110, 210 by upwardly pushing the one end of the flexible display panel 110, 210. Conversely, the flexible display panel 110, 210 may be rolled up into the case 230 by lowering the one end of the flexible display panel 110, 210. The flexible display panel 110, 210 may be unrolled from or rolled up onto a roller 120, 220 provided within the case 230.

As discussed previously, an elevating mechanism is providing for elevating the portion of the flexible display panel 110, 210 by extending the flexible display panel 110, 210 from the case 230. The elevating mechanism includes a guide rail 311 attached to the portion of the flexible display panel 110, 210, and links 303a, 303b configured to elevate the guide rail 311. In addition, as discussed previously, a printed circuit board 130 is connected to the flexible display panel 110, 210 and located within the roller 120, 220, and is configured to transmit a signal from the printed circuit board 130 to the flexible display panel 110, 210 to produce an image by the flexible display panel 110, 210.

It will be apparent to those skilled in the art that various modifications and variations can be made in a rollable display device of the present disclosure without departing from the sprit or scope of the disclosure. Thus, it is intended that the present disclosure covers the modifications and variations of these embodiments provided they come within the scope of the appended claims and their equivalents.

What is claimed is:

1. A display device comprising:
a flexible display panel;
a roller on which the flexible display panel is selectively wound and unwound, the roller having:
a curved surface having a first end and a second end; and
a slit extending longitudinally along the curved surface of the roller, the slit being located between a first sidewall portion of the roller and a second sidewall portion of the roller, the second sidewall portion facing the first sidewall portion to define the slit therebetween, at least a portion of the roller extending continuously along the circumference of the roller from the first sidewall portion to the second sidewall portion with the slit therebetween, wherein the slit is the only slit extending longitudinally along the curved surface of the roller from the first end of the curved surface to the second end of the curved surface; and
a printed circuit board connected to the flexible display panel, the printed circuit board being located within the roller.

2. The display device of claim 1, wherein the roller is configured to rotate about an axis of rotation, and the slit extends parallel to the axis of rotation.

3. The display device of claim 1, further comprising a connector interconnecting one end of the flexible display panel to the printed circuit board.

4. The display device of claim 3, wherein the connector is located within the slit.

5. The display device of claim 1, further comprising a pin connecting the printed circuit board to the roller.

6. A display device comprising:
a flexible display panel;
a roller on which the flexible display panel is selectively wound and unwound, the roller having:
    a curved surface having a first end and a second end; and
    a slit extending longitudinally along the curved surface of the roller, the slit being located between a first sidewall portion of the roller and a second sidewall portion of the roller, the second sidewall portion facing the first sidewall portion to define the slit therebetween, at least a portion of the roller extending uninterrupted from the first sidewall portion to the second sidewall portion;
a printed circuit board connected to the flexible display panel, the printed circuit board being located within the roller; and
a pin connecting the printed circuit board to the roller,
wherein the pin has a first end located in a through hole provided in the roller,
wherein the pin extends through a pin hole provided in the printed circuit board, and
wherein the pin has a second end located in a pin receiving portion provided in the roller.

7. The display device of claim 6, wherein the pin receiving portion is a fixing groove provided in the roller.

8. The display device of claim 1, wherein the roller is a circular cylinder.

9. The display device of claim 1, wherein the curved surface of the roller forms a tube having a hollow interior, and
wherein the slit extends through the curved surface of the roller to the hollow interior.

10. The display device of claim 9,
wherein the roller is configured to rotate about an axis of rotation, and the slit extends parallel to the axis of rotation.

11. The display device of claim 9, further comprising:
a case, the roller being located within the case; and
an elevating mechanism configured to extend the flexible display panel from the case, including:
    a guide rail attached to the flexible display panel; and
    a first link configured to elevate the guide rail.

12. The display device of claim 11, further comprising a first guide bracket located at one end of the first link and movable along the guide rail.

13. The display device of claim 11, further comprising a second link configured to elevate the guide rail.

14. The display device of claim 13, further comprising:
a first guide bracket located at one end of the first link and movable along the guide rail; and
a second guide bracket located at one end of the second link and movable along the guide rail.

15. The display device of claim 14, wherein the first guide bracket and the second guide bracket each include:
a guide portion located within the guide rail; and
a rotational link portion extending from the guide portion,
wherein the rotational link portion of the first guide bracket is rotatably connected to the first link, and the rotational link portion of the second guide bracket is rotatably connected to the second link.

16. The display device of claim 15, further comprising a fixing bracket to which the guide rail is attached,
wherein the fixing bracket includes a fixing portion having an inserting hole into which one end of the flexible display panel is inserted.

17. The display device of claim 11, further comprising a fixing bracket provided at one end of the flexible display panel.

18. The display device of claim 17, wherein the guide rail is attached to the fixing bracket.

19. A display device comprising:
a flexible display panel;
a roller on which the flexible display panel is selectively wound and unwound, the roller having:
    a curved surface having a first end and a second end; and
    a slit extending longitudinally along the curved surface of the roller, the slit being located between a first sidewall portion of the roller and a second sidewall portion of the roller, the second sidewall portion facing the first sidewall portion to define the slit therebetween, at least a portion of the roller extending uninterrupted from the first sidewall portion to the second sidewall portion,
    wherein the curved surface of the roller forms a tube having a hollow interior, and
    wherein the slit extends through the curved surface of the roller to the hollow interior.
a printed circuit board connected to the flexible display panel, the printed circuit board being located within the roller;
a case, the roller being located within the case;
an elevating mechanism configured to extend the flexible display panel from the case, including:
    a guide rail attached to the flexible display panel; and
    a first link configured to elevate the guide rail; and
a fixing bracket provided at one end of the flexible display panel,
wherein the fixing bracket includes a fixing portion having an inserting hole into which the one end of the flexible display panel is inserted.

* * * * *